US00RE46433E

(19) United States
(12) Reissued Patent
Neijzen et al.

(10) Patent Number: US RE46,433 E
(45) Date of Reissued Patent: Jun. 13, 2017

(54) METHOD AND DEVICE FOR IRRADIATING SPOTS ON A LAYER

(75) Inventors: Jacobus Hermanus Maria Neijzen, Eindhoven (NL); Helmar Van Santen, Amsterdam (NL)

(73) Assignee: ASML NETHERLANDS B.V., Veldhoven (NL)

(21) Appl. No.: 13/079,969

(22) Filed: Apr. 5, 2011

Related U.S. Patent Documents

Reissue of:
(64) Patent No.: 7,514,699
Issued: Apr. 7, 2009
Appl. No.: 10/539,313
PCT Filed: Nov. 20, 2003
PCT No.: PCT/IB03/05344
§ 371 (c)(1),
(2), (4) Date: Jun. 15, 2005
PCT Pub. No.: WO2004/057589
PCT Pub. Date: Jul. 8, 2004

(30) Foreign Application Priority Data

Dec. 19, 2002 (EP) ..... 02080392

(51) Int. Cl.
*G01G 5/00* (2006.01)
*G03B 27/52* (2006.01)
(Continued)

(52) U.S. Cl.
CPC ..... *B82Y 10/00* (2013.01); *G03F 7/70341* (2013.01); *G11B 7/122* (2013.01); *G11B 7/1374* (2013.01); *G11B 7/261* (2013.01)

(58) Field of Classification Search
CPC ..... G03F 7/70933; G03F 7/70341; G03F 7/70358; G03F 7/70716; G03F 7/70758;
(Continued)

(56) References Cited

U.S. PATENT DOCUMENTS 3,648,587 A * 3/1972 Stevens ..... 355/44
4,480,910 A * 11/1984 Takanashi et al. ..... 355/30
(Continued)

FOREIGN PATENT DOCUMENTS

DE 206607 * 2/1984 ..... H01L 21/312
DE 206607 A * 2/1984 ..... G02B 1/06
(Continued)

OTHER PUBLICATIONS

English Tanslation of WO 99/495504 (dated Sep. 30, 1999).*
English Translation of JP 6-124873 (dated May 6, 1994).*
English Translation of DD 221 563 A1 (dated Apr. 24, 1985).*

*Primary Examiner* — Henry Tran
(74) *Attorney, Agent, or Firm* — Pillsbury Winthrop Shaw Pittman LLP

(57) ABSTRACT

For irradiating a layer a radiation beam is directed and focussed to a spot on the layer, relative movement of the layer relative to the lens is caused so that, successively, different portions of the layer are irradiated and an interspace between a surface of the lens nearest to the layer is maintained. Furthermore, at least a portion of the interspace through which the radiation irradiates the spot on the layer is maintained filled with a liquid, the liquid being supplied via a supply conduit. At least a portion of the liquid fills up a recess through which the radiation irradiates the spot.

21 Claims, 5 Drawing Sheets

(51) Int. Cl.

| | |
|---|---|
| ***G03B 27/42*** | (2006.01) |
| ***G03C 5/00*** | (2006.01) |
| ***B82Y 10/00*** | (2011.01) |
| *G03F 7/20* | (2006.01) |
| *G11B 7/122* | (2012.01) |
| *G11B 7/26* | (2006.01) |
| *G11B 7/1374* | (2012.01) |

(58) Field of Classification Search

CPC ..... G03F 7/70761; G03F 1/14; G03F 1/114; G03F 7/091; B82Y 15/00; B82Y 20/00; B82Y 35/00

USPC .... 250/216, 234, 235, 492.1, 492.2; 355/30, 355/53, 72, 77; 430/311

See application file for complete search history.

(56) References Cited

U.S. PATENT DOCUMENTS

| | | | | | |
|---|---|---|---|---|---|
| 4,704,348 | A * | 11/1987 | Koizumi et al. | ..... | 430/327 |
| 5,610,683 | A * | 3/1997 | Takahashi | ..... | 355/53 |
| 5,825,043 | A * | 10/1998 | Suwa | ..... | 250/548 |
| 6,000,996 | A | 12/1999 | Fujiwara | | |
| 6,104,687 | A * | 8/2000 | Lee et al. | ..... | 369/112.24 |
| 6,191,429 | B1 * | 2/2001 | Suwa | ..... | 250/548 |
| 6,649,093 | B2 | 11/2003 | Van Santen et al. | | |
| 6,788,477 | B2 * | 9/2004 | Lin | ..... | 359/820 |
| 6,867,844 | B2 * | 3/2005 | Vogel et al. | ..... | 355/30 |
| 6,952,253 | B2 * | 10/2005 | Lof et al. | ..... | 355/30 |
| 6,954,256 | B2 * | 10/2005 | Flagello et al. | ..... | 355/53 |
| 6,970,228 | B1 * | 11/2005 | Aoki et al. | ..... | 355/30 |
| 7,009,682 | B2 * | 3/2006 | Bleeker | ..... | 355/53 |
| 7,061,578 | B2 * | 6/2006 | Levinson | ..... | 355/53 |
| 7,075,616 | B2 * | 7/2006 | Derksen et al. | ..... | 355/30 |
| 7,081,943 | B2 * | 7/2006 | Lof et al. | ..... | 355/30 |
| 7,193,232 | B2 * | 3/2007 | Lof et al. | ..... | 250/548 |
| 7,199,858 | B2 * | 4/2007 | Lof et al. | ..... | 355/30 |
| 7,234,477 | B2 * | 6/2007 | de Larios et al. | ..... | 134/95.2 |
| 7,358,507 | B2 * | 4/2008 | Van Santen | ..... | 250/492.1 |
| 7,416,281 | B2 * | 8/2008 | Nishimura et al. | ..... | 347/54 |
| 7,436,486 | B2 * | 10/2008 | Hirukawa | ..... | 355/53 |
| 2001/0037819 | A1 | 11/2001 | Mitsumori et al. | | |
| 2002/0020821 | A1 * | 2/2002 | Van Santen et al. | ..... | 250/492.2 |

FOREIGN PATENT DOCUMENTS

| | | | | | |
|---|---|---|---|---|---|
| DE | 206607 | A1 | | 2/1984 | |
| DE | 221 563 | A1 | * | 4/1984 | |
| DE | 221563 | A1 | | 4/1985 | |
| JP | 59019912 | A | * | 2/1984 | ..... G02B 7/11 |
| JP | 59019912 | A1 | | 2/1984 | |
| JP | 6-124873 | | * | 5/1994 | |
| JP | 06124873 | A1 | | 5/1994 | |
| JP | 200058436 | A | | 2/2000 | |
| JP | 200058436 | A1 | | 2/2000 | |
| WO | 9949504 | A1 | | 9/1999 | |
| WO | WO 99/49504 | | * | 9/1999 | |

* cited by examiner

METHOD AND DEVICE FOR IRRADIATING SPOTS ON A LAYER

Matter enclosed in heavy brackets [ ] appears in the original patent but forms no part of this reissue specification; matter printed in italics indicates the additions made by reissue; a claim printed with strikethrough indicates that the claim was canceled, disclaimed, or held invalid by a prior post-patent action or proceeding.

The invention relates to a method of irradiating a layer according to the introductory portion of claim 1 and to a device for irradiating a layer according to the introductory portion of claim 9.

Such a method and such a device are known from WO-A-02/13194. According to this publication, the described method and device are used for the manufacturing of an optically scannable information carrier. In such a process, first a master mold is manufactured, and then, by means of the master mold or by means of a daughter mold manufactured by means of the master mold, the information carrier is manufactured by means of a replica process. For manufacturing the master mold, a modulated radiation beam which is directed and focussed to a scanning spot on a photosensitive layer carried by a substrate by means of an optical lens system and the substrate and the lens system are moved relatively to each other. An interspace between the photosensitive layer and a nearest surface of a lens system facing the photosensitive layer is maintained filled up with a liquid.

For moving the substrate relative to the lens system a table carrying the substrate can be rotated about an axis of rotation. By means of a displacement device, the lens system can be displaced with a radial directional component with respect to the axis of rotation of the table. A liquid supply means supplies the liquid into the interspace between the photosensitive layer and a nearest optical surface of the lens system.

A problem of this known method and device is that the immersion of the successive portions of the layer to be irradiated is quite easily disrupted, for instance because the liquid is entrained away from the area of the interspace through which the radiation directed to the radiation spot passes when the layer and the lens move too quickly relative to each other. The immersion can also be disrupted due to important changes in the direction of movement of the lens and the layer relative to each other. The stability of the liquid film between the layer to be irradiated and the nearest optical surface of the lens or lenses can be improved by making the distance between the layer to be irradiated and the nearest optical surface of the lens or lenses very small. However, this entails that the device and in particular the lens nearest to the layer to be irradiated can easily be damaged in the event of contact between the lens and the layer moving relative to each other.

Another method and device for directing a radiation beam to a spot on a photosensitive layer are disclosed in JP-A-10255319. In accordance with this method, a photosensitive layer is applied to a disc-shaped substrate made from glass. The table and the substrate are rotated about an axis of rotation extending perpendicularly to the substrate, and the lens system is displaced, at a comparatively low rate, in a radial direction with respect to the axis of rotation, so that the scanning spot of the radiation beam formed on the photosensitive layer follows a spiral-shaped track on the photosensitive layer. The radiation beam—in this known device a laser beam—is modulated such that a series of irradiated and non-irradiated elements is formed on the spiral-shaped track, which series correspond to a desired series of information elements on the information carrier to be manufactured. The photosensitive layer is subsequently developed, so that the irradiated elements are dissolved and a series of depressions are formed in the photosensitive layer. Next, a comparatively thin aluminum layer is sputtered onto the photosensitive layer, which aluminum layer is subsequently provided with a comparatively thick nickel layer by means of an electro deposition process. The nickel layer thus formed is subsequently removed from the substrate and forms the master mold to be manufactured, which is provided, in the manner described above, with a disc-shaped surface having a series of raised portions corresponding to the desired series of information elements on the information carrier to be manufactured. The master mold thus manufactured can suitably be used in the manufacture of the desired information carriers, however, in general, a number of copies, so-called daughter molds are made by means of the master mold in a replica process. These daughter moulds are used to manufacture the desired information carriers by means of a further replica process, generally an injection molding process. In this manner, the required number of master molds, which are comparatively expensive, is limited. Such a method of manufacturing an optically scannable information carrier, such as a CD or DVD, having pit-shaped information elements by means of a master mold or by means of a daughter mold manufactured by means of the master mold is commonly known and customary.

The interspace between the photosensitive layer and the lens of the lens system facing the photosensitive layer is filled with water. For this purpose, the known device is provided with an outflow opening, which is situated near the axis of rotation of the table. The water supplied via the outflow opening is spread, under the influence of centrifugal forces, substantially throughout the surface of the photosensitive layer, so that also the interspace is filled with water. Since water has a considerably larger optical refractive index than air, the provision of water in the interspace leads to a substantial increase of an angle which the rays originating from the radiation beam and the optical axis of the lens system include at the location of the scanning spot. As a result, the size of the spot formed by the radiation beam on the photosensitive layer is reduced considerably, so that a much larger number of irradiated and non-irradiated elements can be formed on the photosensitive layer, and the information carrier to be manufactured has a higher information density.

Another example of an application in which the gap between a lens and a surface to be irradiated is maintained filled with a liquid are optical imaging methods and apparatus, such as optical projection lithography, in which the spot formed by the radiation projected onto the surface forms an image or a partial image. Such a method and apparatus are described in international patent application WO99/49504.

A drawback of these methods and devices is that the liquid film formed in the interspace is not always reliably maintained fully and in homogenous condition during and after relative displacement of the lens and the surface parallel to the surface. As a result, faults develop in the photosensitive layer. In addition, variations in the condition of the liquid film caused by relative movements of the lens and the surface result in varying forces being exerted on the lens system. Since the lens system is suspended with a limited rigidity, the varying forces exerted by the liquid film cause undesirable vibrations of the lens system, which disturb the precision with which the image is projected onto the surface. Furthermore, a comparatively large quantity of liquid must be supplied to keep a liquid volume in place in the portion of the interspace through which the radiation passes. As a result, the known device must be provided with extensive measures to prevent undesirable contact between the liquid and other parts of the device.

It is an object of this invention to reliably maintain the portion of the interspace between the optical surface nearest to the layer to be irradiated and that layer, through which portion the radiation passes, filled with liquid throughout a larger range of relative velocities and directions of relative displacement of the optical element and the layer.

It is another object of the invention to reduce the risk of damage due to unintentional contact between the optical element and the layer to be irradiated.

According to the invention, these objects are achieved by providing a method according to claim 1. Also according to the invention, a device according to claim 9 is provided for carrying out a method according to claim 1.

By providing that at least a portion of the liquid fills up a recess of which an internal surface bounds the portion of the interspace through which the radiation irradiates the spot, the interspace through which the radiation irradiates the spot can be maintained filled up with liquid with improved stability. Furthermore, a given stability of the liquid volume between the at least one optical element and the layer, can be achieved while maintaining a larger distance between the nearest optical surface and the layer to be irradiated, so that the risk of unintentional contact between the optical element and the layer is reduced.

That the method and the device are less sensitive to the velocity and direction of displacement of the optical element and the layer relative to each other and variations therein, is not only advantageous in the manufacturing of optical information carriers or molds therefor, but also in other applications, such as optical projection imaging, and more in particular in for instance wafer steppers and wafer scanners for optical projection lithography, for example for the production of semiconductor devices in which the direction of movement of the optical element relative to the layer is varied substantially when the wafer is stepped relative to the optical element to bring the optical element into a new position opposite the wafer for projecting the reticle onto a new spot on the wafer or for unrolling (scanning) the projected image of the reticle (mask) over a next area on the wafer. The spot is then formed either by the area of projection of the reticle onto the wafer or by the moving area of projection of a running, usually slit shaped, window portion of the reticle obtained by or as if scanning along the reticle in accordance with movement of the wafer relative to the optical element.

Particular embodiments of the invention are set forth in the dependent claims.

Other objects, features and effects as well as details of this invention appear from the detailed description of a preferred form of the invention.

FIG. 6 is a schematic, cross-sectional view of a distal end portion of a third example of an optical system for a device as shown in. FIG. 1, of a layer to which the radiation is directed and of a liquid flow maintained in operation;

Figure 1:
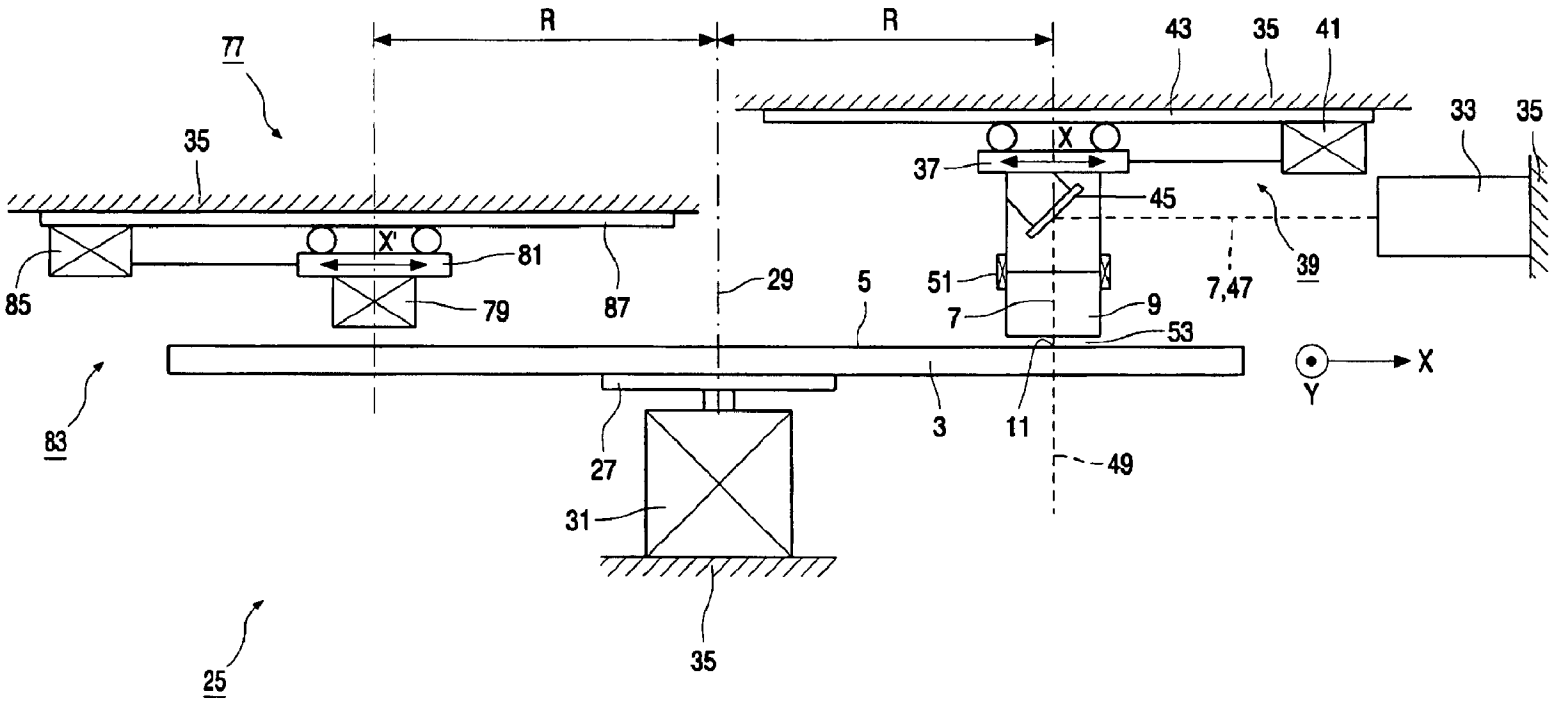
FIG. 1 is a schematic side view of an example of a device for directing radiation to a spot on a layer.

In the manufacture of an optically scannable information carrier, such as a CD or a DVD, a disc-shaped substrate 3 of glass (see FIG. 1) carrying a thin photosensitive layer 5 on one of its two sides is irradiated by means of a modulated radiation beam 7, for instance a DUV laser beam with a wavelength of approximately 260 nm. To irradiate the photosensitive layer 5, use is made of an example 25 of a device in accordance with the invention, which device is described hereinafter with reference to FIGS. 1-3. The radiation beam 7 is focused to a scanning spot 11 on the photosensitive layer 5 by an optical system, according to the present example a lens system 9 including a plurality of lenses. The lens system 9 includes an objective lens 55, which is secured in a lens holder 57. The lens system 9 further includes a most distal lens 59, which is the one of the optical elements of the lens system 9 that is located nearest to the layer 5 when in operation. An interspace 53 is maintained between the layer 5 that is irradiated and the one of the lenses of the lens system 9 that is located nearest to the layer 5. The optical elements may also include other items than lenses, such as filters, shields, diffraction gratings or mirrors.

The layer 5 and the lens system 9 are displaced with respect to each other, so that the modulated radiation beam 7 on the photosensitive layer 5 successively irradiates a series of spaced apart irradiated portions of the layer 5 and does not irradiate portions of the layer 5 in-between the irradiated portions. The irradiated photosensitive layer 5 is subsequently developed by means of a developing liquid, which dissolves the irradiated elements 13 and leaves the non-irradiated elements 15 on the substrate 3. It is also possible to provide that the irradiated portions are left while the non-irradiated portions are dissolved. In both cases, a series of pits or bumps, which corresponds to the desired series of pit-shaped information elements on the information carrier, are formed in the photosensitive layer 5. The photosensitive layer 5 is subsequently covered with a comparatively thin layer of for instance nickel by means of a sputtering process. Subsequently, this thin layer is covered with a comparatively thick nickel layer in an electro deposition process. In the nickel layer, which is eventually removed from the substrate 3, the pattern of pits formed in the photosensitive layer 5 leaves a corresponding pattern that is a negative of the-pattern to be formed in the information carrier to be manufactured, i.e. the master mold comprises a series of raised portions, which correspond to the series of pit-shaped elements formed in the photosensitive layer 5 and to the desired series of pit-shaped information elements on the information carrier. The master mold is thus rendered suitable for use as a mold in an injection-molding machine for injection molding the desired information carriers. Generally, however, a copy of the master mold is used as the mold for injection molding instead of the master mold, which copy of the master mold is commonly referred to as daughter mold, which is manufactured by means of the master mold using a customary replica process which is known per se.

The substrate 3 with the photosensitive layer 5 is placed on a table 27 that is rotatable about an axis of rotation 29, which extends perpendicularly to the table 27 and the substrate 3. The table can be driven by means of a first electromotor 31. The device 25 further comprises a radiation source 33, which, in the example shown, is a laser source, which is secured in a fixed position to a frame 35 of the device 25. It is observed that, as an alternative, the radiation may also be obtained from outside the device. Control over the radiation directed to the layer 5 can be achieved in many ways, for instance by controlling the radiation source 33 and/or by controlling a shutter or radiation diverter (not shown) between the radiation source 33 and the layer 5.

The optical lens system 9 is secured onto a first traveller 37, which can be displaced radially (parallel to the X-direction in the drawings) relative to the axis of rotation 29, by means of a first displacement structure 39. For this purpose, the first displacement structure 39 includes a second electromotor 41 by means of which the first traveller 37 can be displaced over a straight guide 43, which extends parallel to the X-direction and is fixed relative to the frame 35.

A mirror 45 in line with an optical axis 49 of the lens system 9 is also secured to the first traveller 37. In operation, the radiation beam 7 generated by the radiation source 33 follows a radiation beam path 47 extending parallel to the X-direction, and the radiation beam 7 is deflected by the mirror 45 in a direction parallel to the optical axis 49 of the lens system 9. The lens system 9 can be displaced in the direction of its optical axis 49 by means of a focus actuator 51, over comparatively small distances with respect to the first traveller 3, so that the radiation beam 7 can be focused on the photosensitive layer 5. The table 27 with the substrate 5 is rotated about the axis of rotation 29 at a comparatively high speed by means of the first motor 31, and the lens system 9 is displaced parallel to the X-direction by means of the second motor 41 at a comparatively low speed, so that the scanning spot 11 where the radiation beam 7 hits the layer follows a spiral-shaped track over the photosensitive layer 5, leaving a trail of irradiated and non-irradiated elements extending in accordance with this spiral-shaped track.

The device 25 can suitably be used to manufacture master molds having a comparatively high information density, i.e. by means of the device 25, a comparatively large number of irradiated elements can be provided per unit area of the photosensitive layer 5. The attainable information density increases as the scanning spot 11 is smaller. The size of the scanning spot 11 is determined by the wavelength of the radiation beam 7 and by the numerical aperture of the lens system 9, the numerical aperture depending upon the optical refractive index of the medium present between the lens system 9 and the photosensitive layer 5. The scanning spot 11 is smaller as the refractive index of the medium present between the lens system 9 and the photosensitive layer 5 is larger. Liquids typically have a much larger optical refractive index than air and therefore the portion of the interspace 53 between the lens system 9 and the photosensitive layer 5 through which the beam 7 extends is maintained filled with a liquid—according to this example water. In the present example, water is also particularly suitable because it is transparent to the DUV radiation beam 7 used and it does not attack the photosensitive layer 5.

As shown in FIG. 1, the device 25 according to the present example further includes a liquid removal structure 77, which is provided with a pick-up mouth 79. The pick-up mouth 79 is secured onto a second traveller 81 of the device 25, which can be displaced by means of a second displacement structure 83 of the device 25 in a radial direction with respect to the axis of rotation 29, according to the present example parallel to the X-direction, but another radial direction of displacement may be provided. For driving the displacement of the second traveller 81, the second displacement device 83 comprises a third electromotor 85 connected to the second traveller 81 for displacing the second traveller over a straight guide 87, which is attached to the frame 35 and extends in the directions of displacement of the second traveller 81.

In operation, the pick-up mouth 79 is displaced by means of the third motor 85. The third motor 85 is controlled so that the lens system 9 and the pick-up mouth 79 are continuously situated at substantially equal distances R from the axis of rotation 29 of the substrate 3. In this manner, the pick-up mouth 79 is maintained in a position downstream from the lens system 9 where irradiated portions of the layer 5 pass, so that the liquid supplied at the location of the lens system 9 is entrained by the rotating layer 5 to the pick-up mouth 79 where the liquid is subsequently picked-up from the photosensitive layer 5 by the pick-up mouth 79. As the water is thus removed from the photosensitive layer 5 downstream from the lens system 9, it is substantially precluded that water that has already been used finds its way back to the interspace 53, thereby disturbing the accurately dosed liquid flow in the interspace 53. In operation, the pick-up mouth 79 is always at a distance R from the axis of rotation 29 which corresponds to the distance Rat which the lens system 9 is situated from the axis of rotation 29, both the size and the capacity of the pick-up mouth 79 need only to be comparatively small to remove liquid that has already been used.

Figure 2:
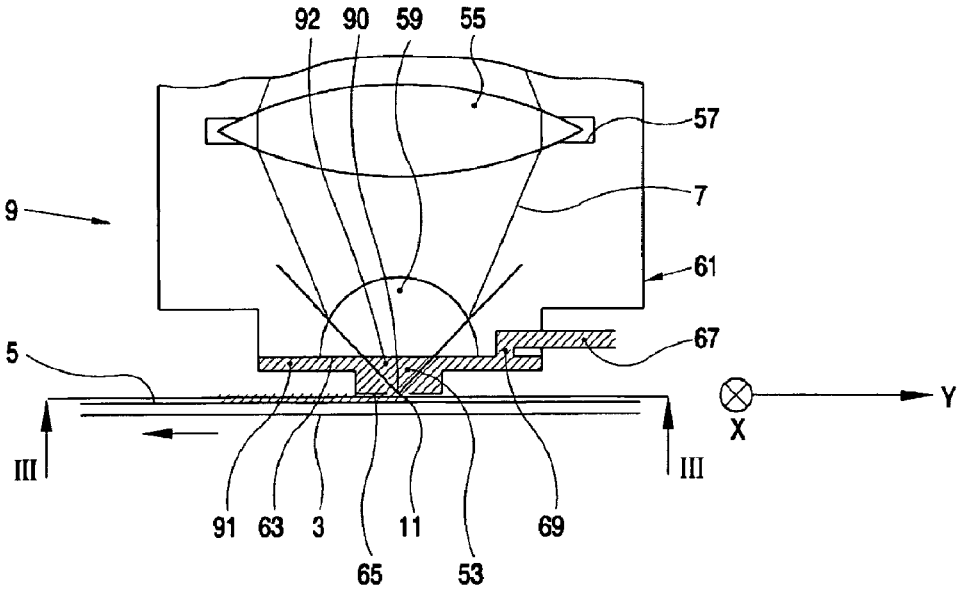
FIG. 2 is a schematic, cross-sectional view of a distal end portion of a first example of an optical system for a device as shown in FIG. 1, of a layer to which the radiation is directed and of a liquid flow maintained in operation.
Figure 3:
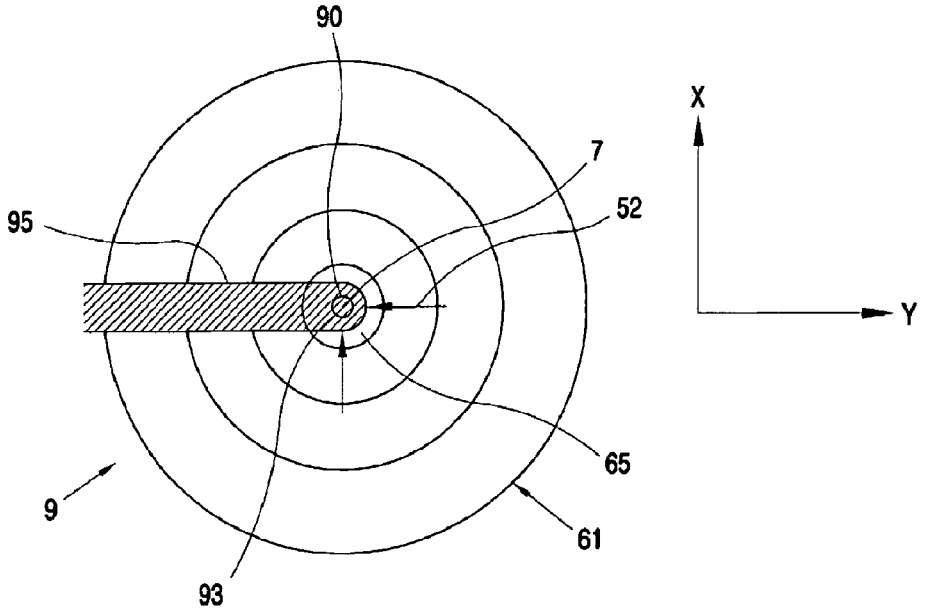
FIG. 3 is a schematic, bottom view along the line III-III in FIG. 2

FIGS. 2 and 3 show, in more detail, the lens system 9, the substrate 3 with the photosensitive layer 5, and the interspace 53 between the-photosensitive layer 5 and the lens system 9. The lens 59 nearest to the layer 5 has an optical surface 63 facing the substrate 3. The lenses 55, 59 are suspended in a housing 61, which includes a flat wall 65, which faces the layer 5 and which substantially extends in an imaginary plane perpendicular to the optical axis of the lens 59 nearest to the layer 5. Between the lens 59 nearest to the layer 5 and the layer 5, a passage 90 is provided in the wall 65, which faces the layer 5. The *wall 65 containing the* passage 90 and the surface 63 of the lens 59 nearest to the layer 5 form a recess 92, *inclusive of the passage 90,* in the surface of the wall 65 facing the spot 11 to which the radiation 7 is directed. The surface 63 of the lens 59 nearest to the layer 5 is part of the internal surface of the recess 92 and bounds the portion of the interspace 53 through which the radiation 7 irradiates the spot 11. According to the present example, the surface 63 of the lens 59 nearest to the layer 5 is flat, however, this surface may also be concave or convex.

In the carrier 61, a liquid supply 67 has a port 69 that opens into the recess 92 directly adjacent the lens 59 nearest to the layer 5. In operation, the portion of the interspace 53 through which the radiation 7 irradiates the spot 11 on the layer 5 is maintained filled with liquid 91. To this end, the liquid 91 is supplied via the port 69 into a portion of the interspace 53 in the recess 92 and through which the radiation 7 irradiates the spot 11. Via a most downstream outflow opening, formed by the passage 90 in the wall 65 between the spot 11 and the surface 63 of the lens 59, the liquid 91 is subsequently also fed to and fills up a portion of the interspace 53 between the wall 65 and the layer 5. In the recess 92, the liquid 91 is, at least to an important extent, protected against being entrained from the interspace 53. Since, the liquid 91 is less susceptible to being entrained away from the portion of the interspace 53 through which the radiation passes to the spot 11, occurrence of the associated optical distortion caused by the portion of the interspace 53 through which the radiation passes not being completely filled with liquid is thus counteracted.

Moreover, the size of the interspace 53 measured parallel to the optical axis of the lenses 55, 59—and thus the distance between the lens 59 and the layer 5—can be relatively large without causing the liquid to be entrained along with movement of the layer 5 too easily. In turn, this reduces the risk of damage to the lens 59 nearest to the layer 5. Moreover, the allowable tolerances on the tilt of the lens can be larger without increasing the risk of the lens 59 touching the layer 5.

The recess 92 may be positioned and of such dimensions, so that only a portion of the radiation passes through the recess. However, for a particularly effective protection of liquid 91 across the whole radiation beam, it is preferred that the recess 92 has a rim portion 93 closest to the layer 5, which extends around the radiation 7 irradiating the spot 11. Accordingly, the portion of the interspace 53 in the recess 92 in which liquid 91 is shielded from being entrained extends throughout the whole cross-section of the radiation beam 7.

According to the present example, the recess 92 is bounded by [the passage 90 in] the wall 65 *containing the passage 90* between the spot 11 and the lens 59 nearest to the spot 11, and by the surface 63 of the lens 59. The surface 63 of the lens 59 nearest to the spot 11 is thereby shield by the wall 65, so that the risk of damage to the lens 59 is virtually eliminated. Moreover, since the wall 65 also shields the liquid 91, the nearest lens 59 does not need to be positioned very near to the layer 5 to effectively keep the interspace 53 between the layer 5 and the nearest lens 59 filled with liquid. The distance between the wall 65 and the layer 5 can be selected to be quite small so that a very effective capillary effect can be achieved for keeping a liquid film in place in the portion of the interspace 53 in the periphery of the passage 90, because inadvertent contact between the wall 65 and the layer 5 has far less detrimental effects than contact between an optical surface such as a lens surface and the layer 5. The wall 65 is preferably made of or covered with a relatively soft material, such as plastic material, so that there is little risk of damage in the event of inadvertent contact between the wall 65 and the layer 5.

The optimum working distance between the layer 5 and the wall 65, i.e. the portion of the lens assembly nearest to the layer 5, is determined by two factors. On the one hand, the distance should be large enough to retain sufficient tolerance on the distance between the substrate 3 and arrangement of the lenses 55, 59 and the housing 61. On the other hand, this distance should not be too large because this would require a too large liquid flow to maintain the immersed condition of the portion of the interspace 53 through which the radiation passes to the spot 11. A presently preferred range for the smallest thickness of the interspace 53 is 3-1500 μm and more preferably 3-500 μm if the liquid is water, larger values for the smallest thickness of the interspace can be particularly advantageous if the liquid has a larger viscosity than water. Also the width of the outflow opening affects the upper end of the preferred range for the smallest thickness of the interspace, the smallest thickness of the interspace being preferably smaller than (100+1/20*W) μm in which W is the overall width of the outflow opening measured in a plane parallel to the layer 5.

Due to the presence of a recess facing the layer 5, the distance between the layer 5 and the nearest optical surface may be larger than approximately 10 μm, for instance larger than 15 m, 30 μm or even 100 μm, to increase the insensitivity to tolerances and to further reduce the risk of contact between the layer and an optical surface.

In the device 25 according to the present example, the liquid supply structure 67 communicates with the passage 90 for maintaining a liquid outflow via the passage 90.

Since the liquid 91 flows out towards the layer 5 via the passage 90 in the wall 65 between the lens 59 and the layer S through which also the radiation 7 passes to the spot 11, the liquid 91 is particularly effectively guided through the interspace 53 through which the radiation passes to the spot 11. Moreover, since the radiation 7 passes to the spot 11 through the outflow opening 90 through which the liquid 91 is directed, the radiation beam 7 extends through the area through which the liquid 91 flows out. This results in a very reliable full immersion of the portion of the interspace 53 through which the radiation passes to the spot during movement parallel to the layer 5 of the lens 59 and the layer 5 relative to each other. Yet another advantage of causing the liquid to flow out via an opening through which also the radiation for irradiating the spot is passed is that a relatively high pressure can be maintained in the immersed area through which the radiation passes. This in turn reduces the risk of bubble formation, which may for instance be caused by gasses dissolved in the liquid under influence of an increase of temperature.

To avoid inclusion of air bubbles in the liquid and for reliably maintaining the filled condition of the portion of the interspace 53 through which the radiation 7 passes to the spot 11, liquid outflow via the outflow opening 90 is preferably such that a liquid volume between the wall 65 and the layer 5 is maintained which includes a liquid volume upstream of the portion of the interspace 53 through which the radiation irradiates the spot 11. Thus, a safety margin of liquid upstream (in a direction opposite to the direction of relative movement of the layer 5 in the area of the spot 11) is formed which ensures that, variations in the distance over which liquid is urged in upstream direction do not cause a disruption of the completely filled condition of the portion of the interspace 53 intersected by the radiation 7 passing to the spot 11.

Furthermore, the liquid 91 flows out from the most downstream outflow opening 90 over a cross-section larger than the largest cross section 94 of the portion of the interspace 53 through which the radiation irradiates the spot 11. This also contributes to the reliable immersion of the interspace 53 with the liquid 91.

As can be seen in FIGS. 2 and 3, the outflow opening 90 has a total projected cross-sectional passage area in a plane parallel to the layer 5 of which, seen in a direction parallel to the optical axis of the lens system 109, the centre is located inside the portion of the interspace 53 through which the radiation 7 irradiates the spot. 11. Accordingly, the average path along which liquid flows out is at least to a large extent centred relative to the portion of the interspace 53 through which radiation passes to the spot 11. Accordingly, the direction of movement of the layer 5 and the lens arrangement 9 relative to each other in the area of the spot 11 can be varied substantially without disrupting complete immersion of the portion of the interspace 53 through which the spot 11 is irradiated. Even if the direction of movement of the layer 5 is varied substantially, the trace of liquid 95 will still cover the entire portion of the interspace 53 through which the spot is irradiated. Nevertheless, areas of the outflow opening 90 around the beam 7 are located close to the beam, so that superfluous wetting of the layer 5 is limited.

According to the present example, the portion of the interspace 53 through which the radiation 7 irradiates the spot 11 is also centrally located relative to the outflow opening 90 to such an extent that the trace 95 of liquid 91 fed from the outflow opening 90 into the interspace 53 completely immerses the portion of the interspace 53 through which the radiation 7 irradiates the spot 11, not only while, in the position of the spot 11, the layer 5 and the at least one lens system 9 move relative to each other in the direction indicated by the arrow 52 (which indicates the direction of movement of the layer 5 relative to the lens system 9), but also while, in the position of the spot 11, the layer 5 and lens system 9 move relative to each other in opposite direction.

More specifically, because in the example shown in FIGS. 2 and 3 the radiation beam 7 passes centrally through the cross-sectional area of the outflow opening 90, the liquid 91 flowing into and out of the outflow opening 90 already immerses the portion of the interspace 53 through which the radiation 7 irradiates the spot 11.

The more the direction of movement of the layer 5 and the lens system 9 parallel to the layer 5 in the area of the spot 11 can be changed without disrupting the immersion of the portion 94 of the area 53 through which the radiation passes, the more the device is suitable for applications in which the spot 11 needs to move over the surface of the layer in widely varying directions, such as in imaging processes in which the spot is a two-dimensional image projected to the layer 5. In such applications, the advantage of a comparatively large refractive index between the lens system and the medium between the lens system and the irradiated surface is that the image can be projected with a higher resolution, which in turn allows further miniaturization and/or an improved reliability.

Figure 9:
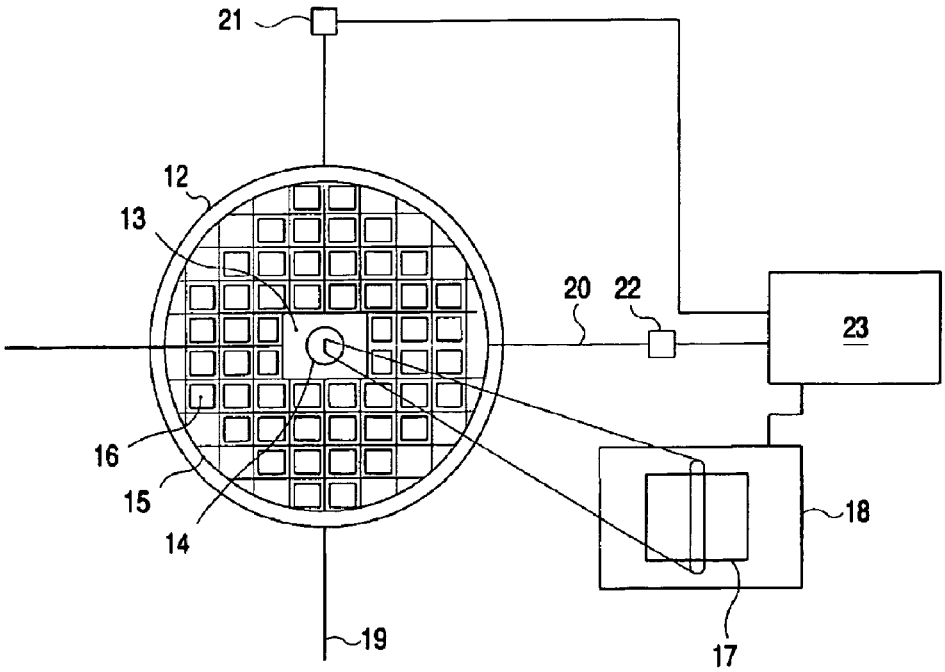
FIG. 9 is a schematic top plan view representation of a wafer stepper/scanner for optical lithography.

An example of such applications is optical projection lithography for the processing of wafers for the manufacture of semiconductor devices. An apparatus and a method for this purpose are schematically illustrated in FIG. 9. Wafer steppers and wafer scanners are commercially available. Accordingly, such methods and apparatus are not described in great detail, but primarily to provide an understanding of liquid immersion as proposed in the present application in the context of such optical imaging applications.

The projection lithography apparatus according to FIG. 9 includes a wafer support 12 and a projector 13 having a lens assembly 14 above the wafer support 12. In FIG. 9, the wafer support 12 carries a wafer 15 on which a plurality of areas 16 are intended to be irradiated by a beam projecting an image or partial image of a mask or reticle 17 in a scanner 18 operatively connected to the projector 13. The support table is moveable in X and Y direction along spindles 19, 20 driven by spindle drives 21, 22. The spindle drives 21, 22 and the scanner 18 are connected to a control unit 23.

Usually one of two principles of operation are applied in optical lithography. In the so-called wafer stepper mode, the projector projects a complete image of the reticle onto one of the areas 16 on the wafer 15. When the required exposure time has been reached, the light beam is switched off or obscured and the wafer 15 is moved by the spindle drives 21, 22 until a next area 16 of the wafer is in the required position in front of the lens assembly 14. Dependent on the relative positions of the exposed area and the next area to be exposed, this may involve relatively quick movement of the lens assembly 14 along the surface of the wafer in widely varying directions. The size of the irradiated spot on the surface of the wafer in which the image of the reticle is projected is typically about 20×20 mm, but larger and smaller spots are conceivable.

In particular when it is desired to manufacture larger semiconductor units, it is advantageous to project the image in the other mode, generally referred to as the wafer scanner mode. In that mode, only a slit-shaped portion of the reticle is projected as a slit shaped spot having a length that is several (for instance four or more times) times larger than its width in an area 16 of the surface of the wafer 15. A typical size for the spot is for instance about 30×5 mm). Then, the reticle 17 to be scanned is moved along scanning window while the wafer support 12 is synchronously moved relative to the lens assembly 14 under control of the control unit 23 with a velocity adapted so that only the projection spot, but not the scanned partial image portions of the reticle 17 that are projected on the wafer move relative to the wafer 15. Thus, the image of the reticle 17 is transferred to an area 16 of the wafer. The movement of the wafer 15 relative to the lens assembly 14 while a running window portion of the reticle is projected onto the wafer 15 is usually carried out slowly and usually each time in the same direction. After the complete image of a reticle 17 has been projected onto the wafer 15, the wafer 15 is generally moved much more quickly relative to the lens assembly 14 to bring a next area of the wafer 15 where a next image of the or a reticle 17 is to be projected in front of the lens assembly 14. This movement is carried out in widely varying directions dependent on the relative positions of the exposed area 16 of the wafer 15 and the next area 16 of the wafer 15 to be exposed. To be able to recommence radiating the surface of the wafer 15 after the displacement of the wafer 15 relative to the lens 14 (i.e. also the lens or the lens and the wafer may be moved), it is advantageous if the liquid volume in the interspace between the lens 14 and the surface of the wafer 15 through which the radiation passes is immediately filled with liquid after completion of that movement, so that the space is reliably immersed before irradiation is recommenced.

Also for optical lithography, water can be used, for instance if the radiation is light of a wavelength of 193 nm. However in some circumstances other liquids may be more suitable.

Figure 4:
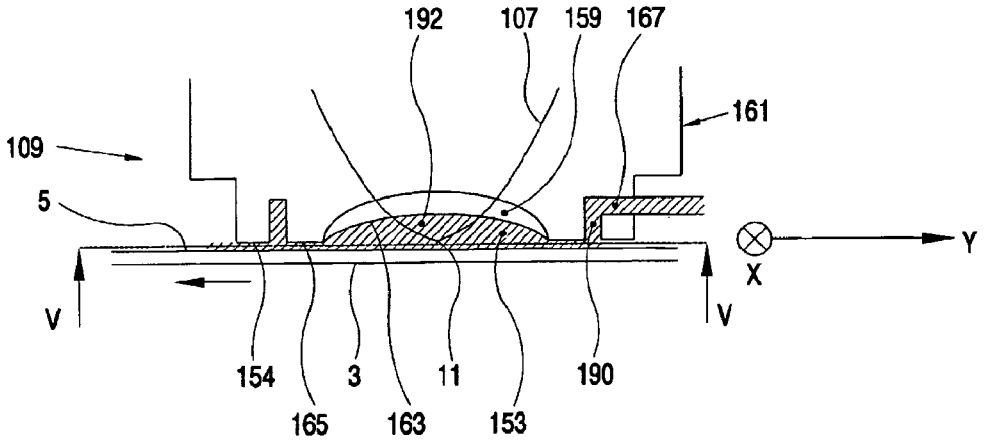
FIG. 4 is a schematic, cross-sectional view of a distal end portion of a second example of an optical system for a device as shown in FIG. 1, of a layer to which the radiation is directed and of a liquid flow maintained in operation.
Figure 5:
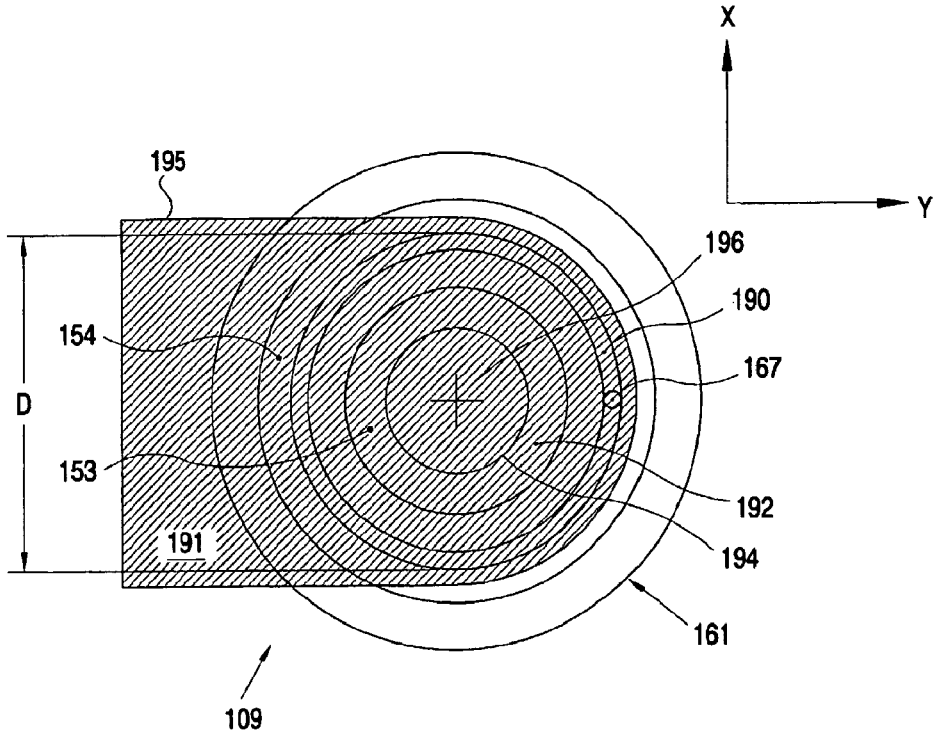
FIG. 5 is a schematic, bottom view along the line V-V in FIG. 4.

FIGS. 4 and 5 show a distal end portion of a second example 109 of a lens system for devices such as the devices shown in FIGS. 1 and 9. The lens system 109 according to this example includes a housing 161, a lens 159 nearest to the layer 5 on the substrate 3. According to this example, the recess 192 is bound by a concave portion of the surface 163 of the lens 159 nearest to the spot 11 on the layer 5 to which the beam of radiation 107 is directed. This allows to obtain the liquid retaining characteristics of a recess in combination with a relatively uniform flow pattern throughout the portion 194 of the interspace 153 through which radiation 107 passes to the spot 11. In particular, a uniform pattern of flow velocity gradients in the interspace 153 is obtained. In turn, the relatively uniform flow pattern is advantageous to avoid inducing vibrations and for obtaining a continuous uniform supply of fresh liquid and thereby a uniform, steady liquid temperature. These effects are both advantageous for avoiding optical disturbance of the radiation beam 107.

In FIG. 5, the dotted circle designated by reference numeral 194 indicates the largest cross section of the portion of the interspace 153 between the lens 159 and the layer 5 through which the radiation beam 107 passes.

For supplying liquid 191 to the interspace 153 between the lens 159 and the layer 5, a liquid supply conduit 167 extends through the housing 161 and leads to an outflow opening 190. According to the present example, the outflow opening 190 has the form of a canal structure in a surface 154 facing the layer 5. The canal structure 190 is open towards the layer 5, for distributing supplied liquid 191 longitudinally along the canal 190 and dispensing distributed liquid towards the layer 5. In operation, the liquid 191 is distributed by the canal structure 190 longitudinally along that canal structure and liquid 191 is dispensed from the canal structure 190 towards the layer 5. This results in a relatively wide, flat liquid trace 195 and full immersion of the portion 194 of the interspace 153 through which the radiation beam 107 passes, even if the direction of movement of the lens system 109 and the layer 5 relative to each other parallel to the plane of the layer 5 is changed substantially.

The canal 190 can have various forms. In the embodiment shown in FIGS. 4 and 5, the canal is formed such that the outflow opening 190 is located outside the radiation beam 107 and extends around the portion 194 of the interspace 153 through which the radiation 7 irradiates the spot 11. The cross 196 indicates the centre, seen in a direction parallel to the optical axis of the lens system 109, of the total cross-sectional passage area of the outflow opening 190. Also in this embodiment, seen in a direction parallel to the optical axis of the lens system 109, the centre of the total cross-sectional passage area of the outflow opening 190 is located inside the portion 194 of the interspace 153 through which the radiation 107 irradiates the spot 11. Furthermore, as in the embodiment discussed above, the portion 194 of the interspace 153 through which the radiation 107 irradiates the spot 11 is centrally located relative to the cross-sectional area of the outflow opening 190 to such an extent that the direction of movement of the lens system 9 and the layer 5, relative to each other and parallel to the plane of the layer 5, can be reversed without disrupting the full immersion of the portion 194 of the interspace 153 through which the radiation beam 107 passes.

Another feature the outflow opening 190 of the example shown in FIGS. 4 and 5 has in common with the outflow opening 90 shown in FIGS. 2 and 3 is that, seen in a direction parallel to the optical axis of the lens system 109, it includes portions that are spaced about the portion 194 of the interspace 153 through which the radiation beam 107 irradiates the spot 11, over such an angle that the trace of liquid 195 fed from the outflow opening 190 into the interspace 153 completely immerses the portion 194 of the interspace through which the radiation irradiates the spot 11 while, in the position of the spot 11, the layer 5 and the lens system 109 move relative to each other in directions parallel to the layer 5 that may be perpendicular to each other. The ability to keep the portion 194 of the interspace through which the radiation passes immersed during movements of the layer 5 and the lens system 109 relative to each other in directions perpendicular to each other is of particular advantage, because it allows to write an image onto the layer 5 while making movements in X- and Y-directions.

The liquid 191 is preferably supplied at a pressure drop over the liquid between the canal structure 190 and the environment that is just sufficient to keep portion of the interspace 153 through which the radiation passes reliably immersed. Thus, the amount of water fed to the surface is kept to a minimum.

Furthermore, when the liquid 191 is dispensed via a canal shaped outflow opening 190, the smallest thickness of the interspace 153 (in this example the distance between the layer 5 and the surface 154 of the wall portion 165) may be larger, without causing an undue risk of disrupting the immersion of the portion 194 of the interspace through which the radiation passes.

The flow rate with which the liquid 191 is supplied is preferably as follows: if the interspace 153 between layer 5 and the surface of the lens system 109 nearest to the layer 5 has a smallest thickness H (measured perpendicular to the layer 5), the layer 5 and the at least one lens 159 are moved relative to each other at a velocity V, the liquid 191 is supplied via an outflow opening 190 having a diameter D measured in a plane parallel to the layer 5, the flow rate is preferably equal to $0.5*\beta*H*(D+\alpha*H)*V$, where $\alpha$ is a constant between 1 and 10 and $\beta$ is a constant between 1 and 3.

Thus, it can be reliably ensured that a laminar flow with an essentially linear velocity profile and preferably a homogeneous Couette flow is present in the interspace 153. Such a flow exerts a substantially constant force on the wall 165 in which the canal 190 is provided and on the side 163 of the lens 159 nearest to the layer 5. As a result, the water present in the interspace 153 exerts substantially no variable liquid forces on the lens system 109. Such varying liquid forces would lead to undesirable vibrations of the lens system 109 and hence to focusing errors and positioning errors of the radiation beam 107 on the photosensitive layer 5. The flow is preferably free of air inclusions, so that the radiation beam 107 is not disturbed thereby.

Figure 6:
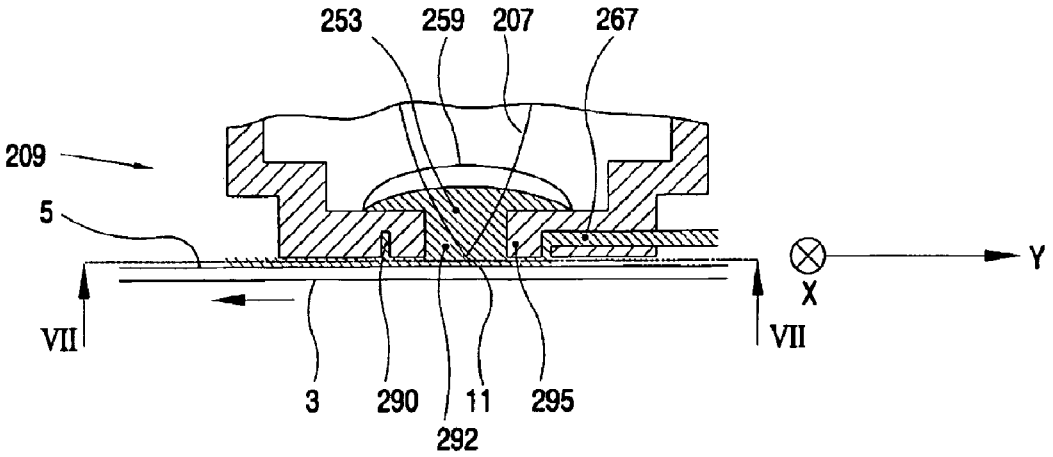
Figure 7:
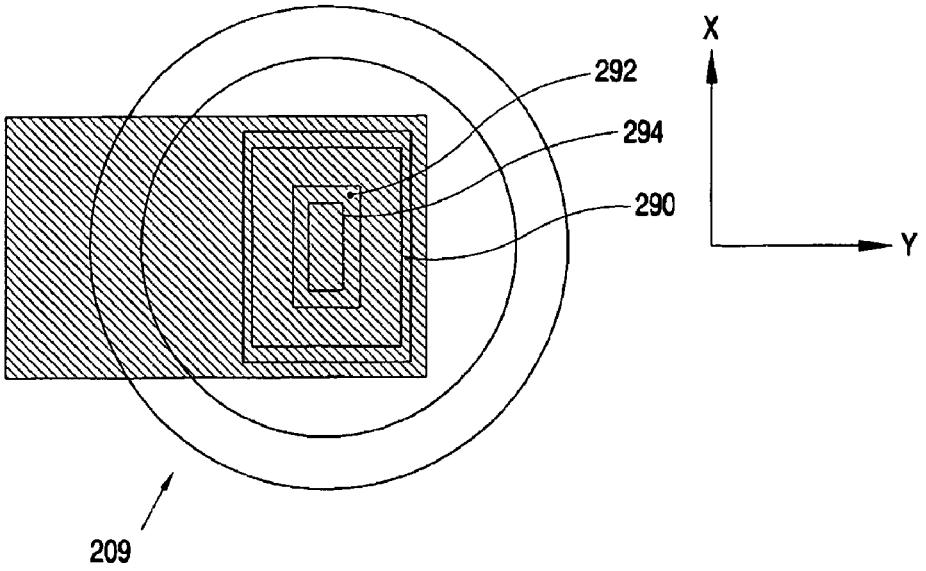
FIG. 7 is a schematic, bottom view along the line VII-VII in FIG. 2.

In FIGS. 6 and 7, a third example of a lens system 209 for devices such as the devices shown in FIGS. 1 and 9 is shown. According to this example, the outflow opening 290 downstream of the liquid supply canal 267 is also provided with a canal structure open towards the layer 5 (i.e. in the direction in which the beam 207 is directed), but has a different, rectangular shape when seen in axial direction of the lens system 209. An essentially rectangular shape is particularly advantageous for reliably immersing a rectangular area 294 of the interspace intersected by the radiation beam while maintaining a uniform liquid flow patter throughout the intersected portion 294 of the interspace, in particular if the movement of the lens system 209 and the layer 5 relative to each other is in a direction perpendicular to one of the sides of the rectangular canal structure 290. Such circumstances typically occur in optical projection lithography.

As in the example shown in FIGS. 2 and 3, the recess 292 is bounded by a passage 295 in a wall 265 perpendicular to the axis of the lens system 9 and a surface of the lens 259 nearest to the spot 11 and the surface of the lens 259 nearest to the spot 11 also bounds the portion 294 of the interspace 253 through which the radiation 207 passes to the spot 1. Accordingly, the lens 259 is effectively protected against damage due to inadvertent contact between the lens system 209 and the layer 5 on the substrate 3. However, according to this example, the passage 295 is not an outflow opening via which liquid is dispensed.

Figure 8:
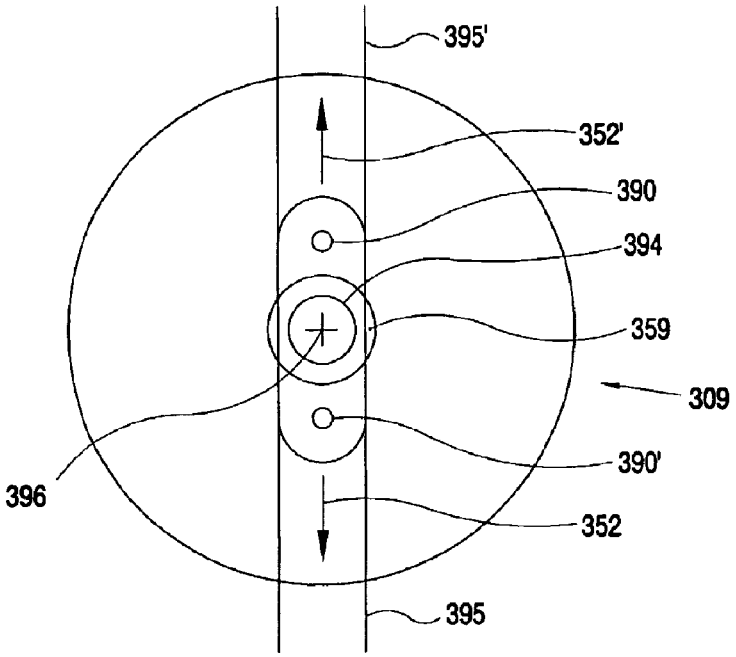
FIG. 8 is a schematic, bottom view of a distal end portion of a fourth example of a optical system for a device as shown in FIG. 1.

The lens system 309 shown in FIG. 8 is provided with two most downstream outflow openings 390, 390' and the portion 394 of the interspace through which the radiation passes to the spot on the layer to be irradiated is located centrally relative to the outflow openings, so that the portion 394 of the interspace through which the radiation passes is fully immersed in a liquid trace 395 dispensed from a first one of the outflow openings 390 if the movement of the layer relative to the lens system 309 in the area of the spot is in a first direction indicated with an arrow 352 and fully immersed in liquid trace 395' dispensed from the other one of the outflow openings 390' if the movement of the layer relative to the lens system 309 in the area of the spot is in a second, opposite direction indicated with an arrow 352'. If it is desired to ensure immersion during relative movement of the lens system 309 and the layer in other directions parallel to the layer, outflow openings 390 can be provided in other angular positions relative to the portion 394 of the interspace through which the radiation is passed, the pressure drop and the flow rate can be increased to create wider liquid traces and/or the outflow openings can be of a different design, for instance slit shaped wherein the slit may for instance be straight or curved about the optical axis of the lens system 309.

Also in the lens system 309 according to this example, seen in a direction parallel to the optical axis of the lens system 309, the centre 396 of the total cross-sectional passage area of the outflow openings 390, 390' is located inside the portion 394 of the interspace 353 through which the radiation passes to the spot 11.

A particular advantage of having a plurality of outflow openings circumferentially spaced around the portion 394 of the interspace through which the radiation passes to the spot on the layer to be irradiated is, that dependent of the direction of movement of the layer and the lens system 309 relative to each other, liquid can be fed selectively from the outflow opening or openings upstream of the spot on the layer to be irradiated only. Thus, the flow rate of the liquid can be limited and the amount of liquid that needs to be picked up is reduced.

The invention claimed is:

1. A method of irradiating a layer, *the method* including:

directing and [focussing] *focusing* a radiation beam to a spot on said layer by means of at least one optical element;

causing relative movement of the layer relative to said at least one optical element so that, successively, different portions of the layer are irradiated and an interspace between *said layer and* a surface of said at least one optical element nearest to said layer is maintained; and maintaining said interspace through which said radiation irradiates said spot on said layer filled with a liquid, the liquid being supplied via a supply conduit;

characterized in that at least a portion of said interspace is bounded by a recess which is filled by at least a portion of said liquid, said radiation beam passing through said liquid in said recess when irradiating said spot, wherein said recess is bounded *at least in part* by [a passage in] a wall between said layer and a surface of said at least one optical element nearest to said layer and by said *surface of said* at least one optical element nearest to said layer, *wherein a passage is formed in said wall as an opening from the recess, wherein said wall has a width-wise axis that extends through the body of the wall, the width-wise axis essentially extending perpendicular to an optical axis, through the interspace, of the radiation beam, wherein said wall has a major exterior surface contacting said liquid, the major exterior surface being essentially perpendicular to the optical axis, extending at least partly underneath said at least one optical element, being a bottom-most surface of the wall and spanning a width that is larger than a height of the wall, and wherein* said radiation beam [passing] *passes* through said passage *while at least a portion of the liquid is flowing out of said passage onto said layer*.

2. The method as claimed in claim 1, wherein the recess has a rim portion positioned between said surface of said at least one optical element nearest to said layer and said layer, closest to said layer and extending around said radiation beam irradiating said spot.

3. The method as claimed in claim 1, wherein a liquid outflow from said recess via said passage is maintained.

4. A The method as claimed in claim 1, wherein a smallest thickness of said interspace is maintained *at a value selected from within the range* of 3-1500 μm.

5. A The method as claimed in claim 1, wherein said recess includes a concave portion of said surface of said at least one optical element nearest to said layer.

6. A The method as claimed in claim 1, wherein the liquid flows out from at least one outflow opening in said recess in the form of at least one canal open towards said layer, said canal distributing supplied liquid longitudinally along said canal and dispensing distributed liquid towards said layer.

7. A method of irradiating a layer including:

directing and focusing a radiation beam to spot on said layer by means of at least one optical element;

causing relative movement of the layer relative to said at least one optical element so that, successively, different portions of the layer are irradiated and an interspace between a surface of said at least one optical element nearest to said layer is maintained; and maintaining at least a portion of said interspace through which said radiation irradiates said spot on said layer filled with a liquid, the liquid being supplied via a supply conduit;

characterized in that at least a portion of said liquid fills up a recess through which said radiation irradiates said spot, wherein said interspace between said layer and said surface of said at least one optical element nearest to said layer has a thickness H, the layer and the at least one optical element are moved relative to each other at a velocity V, the liquid is supplied via an outflow opening having a width W measured in a plane parallel to said layer and at a flow rate equal to [0.5*•*H*(W+•*H)*V] $0.5*\beta*H*(W+\alpha*H)*V$, where [•] $\alpha$ is a constant between 1 and 10 and [•] $\beta$ is a constant between 1 and 3.

8. A device for directing radiation to a layer, *the device* including:

at least one optical element for focussing *a* radiation [originating] *beam* from [said] *a* radiation source to a spot on said layer;

a displacement structure for causing relative movement of the layer relative to said at least one optical element so that, successively, different portions of the layer are irradiated and an interspace between said layer and a surface of said at least one optical element nearest to said spot is maintained; [and]

an outflow opening for supplying liquid to fill said interspace[, in operation, said radiation irradiates said spot on said layer through said liquid,]; *and*

[characterized in that said device further comprises] a recess having an internal surface bounding at least [said] *a* portion of said interspace through which said radiation irradiates said spot *on said layer through said liquid*, [said outflow opening being formed in said recess, wherein] said recess [is] *being* bounded *at least in part* by [a passage in] a wall between said spot and a surface of said at least one optical element nearest to said spot and by said surface of said at least one optical element nearest to said spot, *a passage for liquid flow formed in said wall, wherein said wall has a width-wise axis that extends through the body of the wall, the width-wise axis essentially extending perpendicular to an optical axis, through the interspace, of the radiation beam, wherein said wall has a major exterior surface arranged to contact said liquid, the major exterior surface being essentially perpendicular to the optical axis, extending at least partly underneath said at least one optical element, being a bottom-most surface of the wall and spanning a width that is larger than a height of the wall, and wherein said outflow opening is formed in said recess above said passage and* said passage [forming said outflow opening] *is a further opening in the recess and is arranged to have the radiation beam pass therethrough onto said spot.*

9. The device as claimed in claim 8, wherein said recess has a rim portion closest to said layer extending around said portion of said interspace through which, in operation, said radiation irradiates said spot.

10. The device as claimed in claim 8, wherein said device further comprises a liquid supply structure communicating with said recess for maintaining a liquid outflow via said passage.

11. The device as claimed in claim 8, wherein said device is arranged for maintaining a smallest thickness of said interspace *at a value selected from within the range* of 3-1500 μm.

12. The device as claimed in claim 8, wherein said recess includes a concave portion of said surface of said at least one optical element nearest to said spot.

13. The device claimed in claim 8, wherein the at least one outflow opening is formed by at least one canal open towards said layer, for distributing supplied liquid longitudinally along said canal and dispensing distributed liquid towards said layer.

*14. The method as claimed in claim 1, wherein said major surface of the wall is upward facing.*

*15. A device manufacturing method comprising:*

*forming a beam of radiation with an image of a mask or reticle; and*

*irradiating a layer with the image using the method as claimed in claim 1.*

*16. The device as claimed in claim 8, wherein said major surface of the wall is upward facing.*

*17. A lithography apparatus comprising:*

*a wafer support table configured to support a wafer to be irradiated;*

*a scanner configured to have a reticle or mask;*

*a drive, coupled to the wafer support table, configured to move the support table in X and Y directions;*

*a control unit configured to control the drive and the scanner; and*

*a device as claimed in claim 8.*

*18. A method comprising:*

*directing and focusing a radiation beam to a spot on a layer by means of at least one optical element;*

*causing relative movement of the layer relative to said at least one optical element so that, successively, different portions of the layer are irradiated and an interspace between said layer and a surface of said at least one optical element nearest to said layer is maintained; and*

*maintaining said interspace through which said radiation irradiates said spot on said layer filled with a liquid, the liquid being supplied via a supply conduit, wherein at least a portion of said interspace is bounded by a recess which is filled by at least a portion of said liquid, said radiation beam passing throuqh said liquid in said recess when irradiating said spot, and wherein the boundary of said recess is formed at least in part by a wall between said layer and said surface of said at least one optical element nearest to said layer, wherein a passage for liquid flow is formed in said wall as an opening from the recess, wherein said wall has a width-wise axis that extends through the body of the wall, the width-wise axis essentially extending perpendicular to an optical axis, through the interspace, of the radiation beam, wherein said wall has a major exterior surface contacting said liquid, the maior exterior surface being essentially perpendicular to the optical axis, extending at least partly underneath said at least one optical element, being a bottom-most surface of the wall and spanning a width that is larger than a height of the wall, and wherein said radiation beam passes through said passage while at least a portion of the liquid is flowing out of said passage onto said layer.*

*19. A device manufacturing method comprising:*

*forming a beam of radiation with an image of a mask or reticle; and*

*irradiating a layer with the image using the method as claimed in claim 18.*

*20. A device comprising:*

*at least one optical element configured to focus a radiation beam from a radiation source to a spot on a layer;*

*a displacement structure configured to cause relative movement of the layer relative to said at least one optical element so that different portions of the layer are irradiated;*

*an outflow opening configured to supply liquid to fill an interspace between said layer and a surface of said at least one optical element nearest to said spot; and*

*a recess having an internal surface bounding at least a portion of said interspace through which said radiation irradiates said spot on said layer through said liquid, said recess being bounded at least in part by a wall between said layer and said surface of said at least one optical element nearest to said layer, a passage being formed in said wall, wherein said wall has a width-wise axis that extends through the body of the wall, the width-wise axis essentially extending perpendicular to an optical axis, through the interspace, of the radiation beam, wherein said wall has a major exterior surface arranged to contact said liquid, the major exterior surface being essentially perpendicular to the optical axis, extending at least partly underneath said at least one optical element, being a bottom-most surface of the wall and spanning a width that is larger than a height of the wall, and wherein said outflow opening is formed in said recess above said passage and said passage is a further opening in the recess and is arranged to have the radiation beam pass therethrough onto said spot.*

*21. A lithography apparatus comprising:*

*a wafer support table configured to support a wafer to be irradiated;*

*a scanner configured to have a reticle or mask;*

*a drive, coupled to the wafer support table, configured to move the support table in X and Y directions;*

*a control unit configured to control the drive and the scanner; and*

*a device as claimed in claim 20.*

* * * * *